(12) United States Patent
Fan et al.

(10) Patent No.: US 11,243,225 B2
(45) Date of Patent: Feb. 8, 2022

(54) ACCELERATION SENSOR COMPRISING DIFFERENTIAL GRAPHENE RESONANT BEAMS

(71) Applicant: Beihang University, Beijing (CN)

(72) Inventors: Shangchun Fan, Beijing (CN); Futao Shi, Beijing (CN); Weiwei Xing, Beijing (CN)

(73) Assignee: Beihang University, Beijing (CN)

( * ) Notice: Subject to any disclaimer, the term of this patent is extended or adjusted under 35 U.S.C. 154(b) by 187 days.

(21) Appl. No.: 16/611,719

(22) PCT Filed: Jan. 22, 2018

(86) PCT No.: PCT/CN2018/073668
§ 371 (c)(1),
(2) Date: Nov. 7, 2019

(87) PCT Pub. No.: WO2018/205683
PCT Pub. Date: Nov. 15, 2018

(65) Prior Publication Data
US 2021/0140991 A1     May 13, 2021

(30) Foreign Application Priority Data

May 12, 2017 (CN) .......................... 201710332648.2

(51) Int. Cl.
*G01P 15/097* (2006.01)
*G01P 15/08* (2006.01)
(52) U.S. Cl.
CPC ........ *G01P 15/097* (2013.01); *G01P 15/0802* (2013.01); *B81B 2201/0235* (2013.01)
(58) Field of Classification Search
CPC .... G01P 15/02; G01P 15/0802; G01P 15/097; G01P 2015/0805; B81B 3/0018; B81B 2201/0235
See application file for complete search history.

(56) References Cited

U.S. PATENT DOCUMENTS

| 6,848,307 | B1 | 2/2005 | Kurtz et al. | |
| 2013/0111971 | A1* | 5/2013 | Pudas | G01P 15/0891 73/12.01 |
| 2015/0362521 | A1* | 12/2015 | Hurst | G01P 15/18 73/514.35 |

FOREIGN PATENT DOCUMENTS

| CN | 2748921 Y | 12/2005 |
| CN | 104374953 A | 2/2015 |
| (Continued) | | |

OTHER PUBLICATIONS

International Search Report issued in Application No. PCT/CN2018/073668, dated Apr. 3, 2018 (5 pages).
(Continued)

*Primary Examiner* — Benjamin R Schmitt
(74) *Attorney, Agent, or Firm* — Osha Bergman Watanabe & Burton LLP (57) ABSTRACT

An acceleration sensor with differential graphene resonant beams includes a substrate, a sensitive mass plate, a first insulating layer, a second insulating layer, a first excitation electrode pair, a first graphene resonant beam, a second graphene resonant beam, a third insulating layer, a second excitation electrode pair, and a vacuum cover. An indirect acceleration-sensitive mode is adopted, so that the sensitive mass block directly senses acceleration to be measured, and converts the acceleration to be measured into a concentrated force to cause axial displacement of the sensitive mass block and then to cause a change in the axial stress of the graphene resonate beams, thereby causing a change in the resonant frequency of the beams.

15 Claims, 2 Drawing Sheets

(56) References Cited

FOREIGN PATENT DOCUMENTS

| | | |
|---|---|---|
| CN | 106771358 A | 5/2017 |
| CN | 107015025 A | 8/2017 |
| CN | 107255736 A | 10/2017 |

OTHER PUBLICATIONS

Written Opinion issued in Application No. PCT/CN2018/073668, dated Apr. 3, 2018 (5 pages).
Jie, Wenbin et al., "Acceleration Sensing Based on Graphen Resonator", Proc. SPIE 10256, Second International Conference on Photonics and Optical Engineering, vol. 10256, Feb. 28, 2017, pp. 102562E-1 to 102562E-8 and Figure 1a (9 pages).
Chen, Zhiyong et al., "A Micromachined Silicon Resonant Accelerometer", Chinese Journal of Scientific Instrument, Jun. 30, 2009, Suppl. 6(30), ISSN: 0254-3087, pp. 456-460 and Figure 2 (5 pages).

\* cited by examiner

ACCELERATION SENSOR COMPRISING DIFFERENTIAL GRAPHENE RESONANT BEAMS

TECHNICAL FIELD

The invention belongs to the technical field of micro/nano electromechanical systems, and relates to an acceleration sensitive structure and an acceleration sensor comprising differential graphene resonant beam.

BACKGROUND OF THE PRESENT INVENTION

Based on mechanical resonance technology, the sensor is called resonant sensor, which is realized by the natural resonance characteristics of the resonant element changing with the measured value. Resonant sensor itself outputs periodic signals (quasi-digital signals), which can be converted into digital signals easily received by a microprocessor by simple digital circuits (not A/D converter circuits). At the same time, due to the excellent repeatability, resolution and stability of a resonant sensing unit, resonant measurement principle naturally becomes the focus of current research.

The resonant acceleration sensor measures the acceleration by the change of the natural frequency of the resonant beam with the measured acceleration. When the resonant beam is stimulated, it vibrates with its natural frequency. When the acceleration is applied to the acceleration sensor, the axial displacement of the resonant beam will occur, and the stiffness of the resonant beam will change, leading to the change of its natural frequency accordingly. The change of the natural frequency can be detected by capacitance detection method, and the specific acceleration value can be obtained after the calculation. Resonant accelerometer has high accuracy and plays an important role in applications such as inertial navigation and microgravity detection, etc.

In recent years, technologies for resonant silicon microstructural accelerometers made of monocrystalline silicon material by micro-machining technology have developed rapidly, and miniature and micro-sized resonant accelerometers have been developed. Graphene is a new carbon-based nano-ultrathin material with excellent properties. Its excellent mechanical, electrical and photomagnetic properties determine that graphene has great application prospects in the fields of nanoelectronics, optoelectronics, magnetoelectronics devices and NEMS, etc., so it has attracted extensive attention of researchers. Following the first preparation of single graphene by Andre Geim and Konstantin Novoselov, University of Manchester in 2004, using mechanical splitting mechanical micromachining, the research on graphene and nanobelts has attracted more and more attention. One of the focuses is the study of the resonance characteristics of graphene and nanobelts. The theoretical thickness of monolayer graphene is only 0.335 nm, the in-plane Young's modulus is 1 TPa, and the fracture strength is 130 GPa, which is much better than the overload capacity of silicon, carbon nanotubes and other materials. The theoretical research and key technological breakthroughs of graphene resonant sensor are mostly based on experimental science or experimental technology, which is manifested in the research on the characteristics of resonator and some exploratory work on resonant sensor. However, the research on graphene resonant beam sensor, especially on acceleration measurement, has not touched the practical sensor layer yet. The research of differential resonant beam acceleration sensor is still blank.

For the resonant acceleration sensor, the change of resonant frequency caused by off-axis crosstalk not only affects the measurement accuracy and sensitivity of the sensor, but also affects the operational stability of the sensor. In addition, in order to improve the sensitivity of acceleration measurement, most methods need to redesign the resonant sensing structure, which greatly increases the design cost and production cycle.

At present, there have been studies on acceleration measurement by mass sensing acceleration, which displaces mass and drives the resonant sensor to produce axial strain. However, few studies have reported the use of graphene as sensing elements. In the study of measuring acceleration by using the vibration characteristics of graphene beams, mass blocks or additional mass are directly attached to the surface of graphene beams. There are few reports on the study of using mass blocks as sensitive acceleration components and meanwhile ensuring that mass blocks do not contact graphene beams directly.

SUMMARY OF THE PRESENT INVENTION

The technical problem to be solved by the present invention is to overcome the shortcomings of the existing technology and provide a differential graphene resonant beam acceleration sensor with small size, strong anti-interference ability, high sensitivity and minimal acceleration sensing ability.

The technical solution adopted by the invention to solve its technical problem in the prior art is as follows. A differential graphene resonant beams acceleration sensor comprises a substrate, a sensitive mass plate, a first insulation layer, a second insulation layer, a third insulation layer, a first graphene resonant beam, a second graphene resonant beam, a first excitation electrode pair, a second excitation electrode pair, and a vacuum cover. A ring groove is etched on the substrate to form a raised rectangular platform on the substrate; the first insulation layer is covered in the middle of the surface of the raised rectangular platform on the substrate; the sensitive mass plate is etched to form a sensitive mass block, a support beams of U-shaped thin plate structure and two graphene beam placing grooves symmetrically distributed along the axis of the mass plate; the sensitive mass plate is fixed above the substrate, and the inside side of the frame is aligned with the outside side of the substrate groove. Two grooves in the sensitive mass plate are covered with the second insulation layer and the third insulation layer respectively; two ends of the first graphene resonant beam is adsorbed on the first insulation layer and the second insulation layer respectively; two ends of the second graphene resonant beam are adsorbed on the first insulation layer and the third insulation layer respectively, thus forming two double-end-fixed-supported resonant beams; the first excitation electrode pair and the second excitation electrode pair are placed on the first graphene resonant beam and the second graphene resonant beam respectively. The electrode pair and the excitation electrode pair are used to excite the resonant beam to be in the resonant state; the vacuum cover is fixed on the substrate, and the inner groove of the vacuum cover is leveled with the outer side of the sensitive mass plate (the outer side of the frame of the sensitive mass plate), thus closing the accelerometer.

The substrate material is the same as the sensitive mass plate material, and the two constitute the main body of the acceleration sensor.

The insulation layer, including the first insulation layer, the second insulation layer and the third insulation layer, can be formed by chemical vapor deposition of the substrate material, thermal growth oxidation and other methods. The thicknesses of the first insulation layer, the second insulation layer and the third insulation layer are the same, and are not more than $1/5$ of the thickness of the sensitive mass plate.

Among them, the material and geometric dimensions of the first graphene resonant beam and the second graphene resonant beam are the same, and the thicknesses of the first graphene resonant beam and the second graphene resonant beam are thicknesses of one or more graphene layers. The lengths and widths of the graphene resonant beams are much larger than their thicknesses, and the length-width ratio is not less than 5. It is placed along the axis direction of the sensitive mass plate and in vacuum environment.

Among them, the first graphene resonant beam and the second graphene resonant beam are both electrically excited, and the first excitation electrode pair and the second excitation electrode pair are equipped with an external connection circuit.

Among them, the material of the substrate and the sensitive mass plate can be monocrystalline silicon or silicon carbide or carbon, and the first insulation layer, the second insulation layer and the third insulation layer can be formed by silicon dioxide or silicon nitride.

Among them, the sensitive mass plate is provided with four or more support beams of U-shaped thin plate structure. These support beams of U-shaped thin plate structure have the same geometric dimensions, and the number of support beams of U-shaped thin plate structure on one side of the sensitive mass block can be two or multiple of two. Support beams of U-shaped thin plate structures on one side of sensitive mass blocks may include one or more pairs of support beams of U-shaped thin plate structures.

Among them, in order to ensure that the vacuum cover has enough wall thickness and the sensitive mass plate has enough assembly space on the substrate, the distance between the groove on the substrate and the four sides of the corresponding substrate should be more than 6 um at the same time, and the thickness of the outer frame of the sensitive mass plate should not be less than $1/3$ of the distance between the groove on the substrate and the four sides of the corresponding substrate, nor greater than $1/2$ of the distance between the groove on the substrate and the four sides of the corresponding substrate.

Among them, in order to reduce the errors in assembling the substrate and the sensitive mass plate and ensure the high symmetry of the structure of the differential graphene resonant beam acceleration sensor, the dimensions of the inner side of the frame of the sensitive mass plate should be basically consistent with the dimensions of the grooves on the substrate. Specifically, the lateral dimensions of the sensitive mass plate frame are consistent with those of the grooves on the substrate, except the place where the support beams of U-shaped thin plate structure is connected in the sensitive mass plate frame.

Among them, in order to ensure the flexible movement of the sensitive mass block on the sensitive mass plate, the groove depth on the substrate is no less than $1/6$ of the thickness of the substrate and not more than $2/3$ of the thickness of the substrate.

Among them, in order to prevent the sensitive mass block from touching the raised rectangular platform on the substrate during its movement, the geometric center of the raised rectangular platform should coincide with the geometric center of the substrate, and the length and width of the raised rectangular platform should ensure that the distance between the four sides of the raised rectangular platform and the inside of the sensitive mass block is no less than twice the width of the U-shaped thin plate support beam.

Among them, in order to ensure that the first graphene resonant beam and the second graphene resonant beam are clamped horizontally, the height of the raised platform on the substrate should ensure that the upper surface of the raised platform and the bottom surface of the graphene beam placing groove on the substrate are on the same horizontal plane.

Among them, the lengths of the first excitation electrode pair and the second excitation electrode pair are no less than the width of the graphene beam and the widths of the first excitation electrode pair and the second excitation electrode pair are no more than the groove widths of the first graphene resonant beam and the second graphene resonant beam, and the thicknesses of the first excitation electrode pair and the second excitation electrode pair are no more than $1/5$ of the thickness of the sensitive mass plate.

Among them, the length and width of the first insulation layer are no less than the corresponding size of the excitation electrode and no more than the size of the raised platform. The lengths and widths of the second insulation layer and the third insulation layer are the same as the size of the groove used to place the excitation electrodes of the first graphene resonant beam and the second graphene resonant beam. The thicknesses of the first insulation layer, the second insulation layer and the third insulation layer are the same and their thicknesses are all no greater than that $1/5$ of the thickness of the sensitive mass plate.

Among them, the width of single side plate of U-shaped thin plate structure is $1/4$ of the width of the whole support beams, and the spacing between two arms is $1/2$ of the width of the support beams. The length of each pair of support beams on one side of the mass block is not less than $1/2$ of the width of the sensitive mass block. The thickness of the support beams is consistent with that of the sensitive mass block.

The acceleration sensor structure of the present invention will set the acceleration-sensitive mass block on the sensitive mass plate, and use the graphene material as a composite resonant sensitive element which is sensitive to acceleration in the form of a beam. The two components are combined. The mass block generates an axial displacement and drives the resonated graphene beam to generate an axial stress change, resulting in a change in the resonant frequency of the resonant beam. The change of resonant frequency is detected to measure the applied acceleration.

The principle and working process of the present invention are as follows: when the measured acceleration acts on the sensitive mass plate, it is converted into a concentrated force, so that the mass block of the support beams of U-shaped thin plate structure produces a small axial displacement, at the same time, it drives one end of the double-end-fixed-supported graphene resonant beam to produce displacement, thereby causing the change of the axial stress of the graphene resonant beam. The two axially resonant graphene beams work in differential mode. The axial acceleration causes the change of the axial stress of graphene. The axial stress of one resonant graphene beam increases and the resonant frequency increases, and while, the axial stress of the other resonant graphene beam decreases and the resonant frequency decreases. The measured acceleration can be characterized by measuring the resonant frequencies of two graphene resonant beams.

Compared with the prior art, the invention has the advantages of:

(1) The support beams of the sensitive mass block in the present invention is designed with U-shaped thin plate. The thickness of the single side plate of the U-shaped thin plate is much smaller than the axial size of the mass block, and the mass block moves in a smaller range in the axial direction, so as to obtain a larger sensitive mass, improve the sensitivity of the mass block to micro-accelerations, and realize the acceleration displacement sensitivity with ultra-high level. The structure can ensure that the moving mass block has good axial stiffness, make the mass block fully sensitive to the axial acceleration, and eliminate the influence of movement of the mass block caused by the lateral acceleration.

(2) Four or more U-shaped thin plate support beams with a certain thickness and a relatively long cantilever in the present invention are paired to support the mass blocks to solve the problem of stress concentration under the working condition of a single support beams. The sufficient length of the U-shaped support beam restricts the possible rotation of the mass block around the axis (i.e. the mass block axis, corresponding to the y-axis mentioned below), and the sufficient thickness of the mass block restricts the possible upward and downward movement of the mass block along the vertical direction (i.e. the thickness direction of the mass block, corresponding to the z-axis mentioned below), thereby reducing the impact of acceleration in other directions on acceleration in the required measured axial (y-axis).

(3) The resonant structure adopted in the present invention distributes symmetrically along the center of gravity of the mass block, making the whole sensitive structure highly symmetrical. Combining with the role of support beams of U-shaped thin plate, the sensitive axial displacement and the rotation around other directions of the mass block caused by the non-sensitive axial acceleration can be eliminated fundamentally. While ensuring the acceleration displacement sensitivity with ultra-high level, the resonant structure has smaller off-axis crosstalk and ensures the resonant frequency of the resonant sensitive element is higher.

(4) The differential resonant structure adopted in the invention can enhance the detection signal, improve the nonlinearity of the accelerometer, improve the sensitivity and measurement accuracy, and meanwhile have a good suppression and compensation effect on the influence of conjugate interference, so that the accelerometer has a good anti-interference performance.

(5) The substrate groove in the present invention can make the mass block suspended, avoiding friction with the insulating silicon substrate, ensuring the smooth movement of the mass block in the axial direction, and improving its sensitivity to acceleration. At the same time, the substrate groove corresponding to the outside dimension of the accelerometer sensitive mass block, which is beneficial to the positioning of the sensitive structure in the process of accelerometer manufacture, eliminates the positioning error in the process of accelerometer assembly, and further ensures the high symmetry of the whole sensitive structure.

(6) The present invention uses graphene as resonant beam material, and the thickness of monolayer graphene is only 0.335 nm, which reduces the size of graphene resonator from micron to nano or submicron, thus realizing the miniaturization of graphene acceleration sensor and the possibility of micro-acceleration measurement.

(7) The vacuum cover and the substrate of the present invention form a strictly sealed vacuum environment, and the resonant structure of the resonant sensor is encapsulated in the vacuum chamber, thereby obtaining a higher mechanical quality factor of the beam harmonic oscillator and realizing the function of the ultra-high sensitivity acceleration sensor.

in which:
1: substrate; 2: sensitive mass plate; 3: insulation layer I; 4: insulation layer II; 5: excitation electrode pair I; 6: graphene resonant beam I; 7: graphene resonant beam II; 8: insulation layer III; 9: excitation electrode pair II; 10: vacuum cover.

DETAILED DESCRIPTION OF THE PRESENT INVENTION

The present invention is further described in connection with the drawings and the specific implementation.

Figure 1:
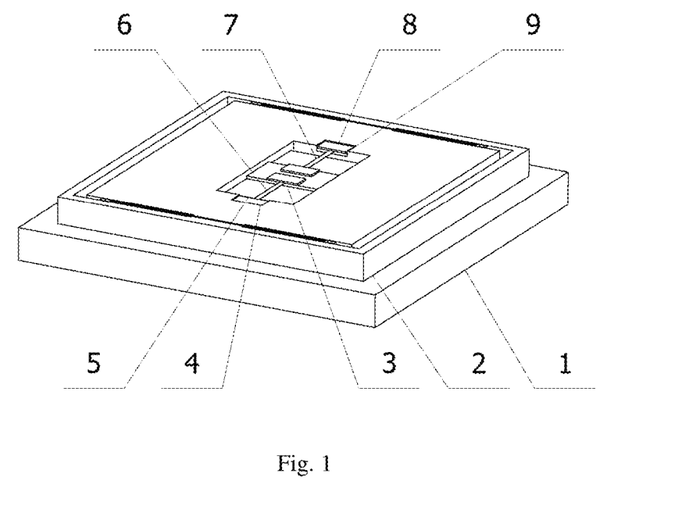
FIG. 1 is a schematic diagram of the structure of the differential graphene resonant beam acceleration sensor of the present invention.
Figure 2:
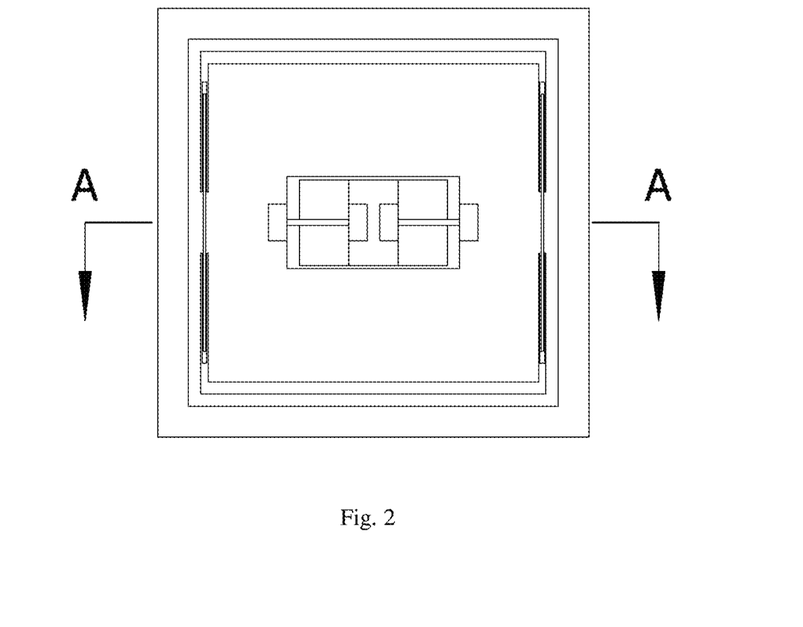
FIG. 2 is the top view of the resonant acceleration sensor when the upper vacuum cover is removed in the present invention.
Figure 3:
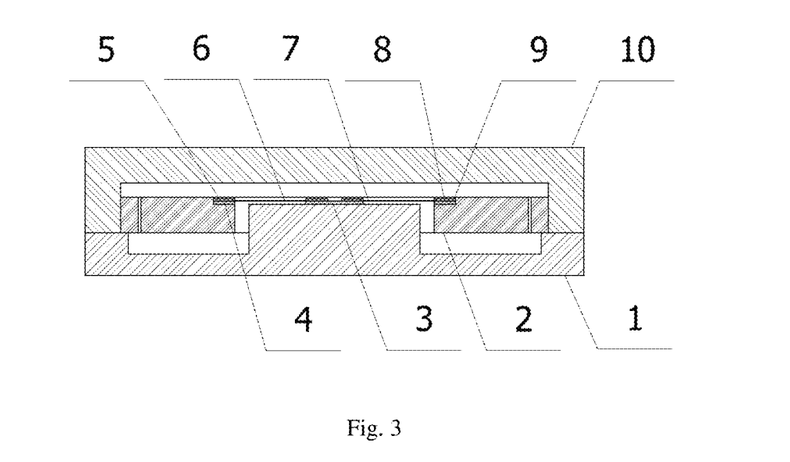
FIG. 3 is a sectional view of the differential graphene resonant beam acceleration sensor of the invention.

As shown in FIG. 1, FIG. 2 and FIG. 3, the differential graphene resonant beam acceleration sensor of the embodiment mainly includes the substrate 1, the sensitive mass plate 2, insulation layer I 3, insulation layer II 4, excitation electrode pair I 5, graphene resonant beam I 6, graphene resonant beam II 7, insulation layer III 8, excitation electrode pair II 9 and the vacuum cover 10. Excitation electrode pair I 5 includes two first excitation electrodes 5; one end of graphene resonant beam I 6 (the left end of graphene resonant beam I 6 shown in FIG. 4) is placed between the first excitation electrode of the two excitation electrodes I 5 and insulation layer II 4 and clamped by the first excitation electrode and insulation layer II; the other end of graphene resonant beam I 6 (the right end of graphene resonant beam I 6 in FIG. 4) is placed between the other first excitation electrode of the two first excitation electrodes 5 and insulation layer I 3 and clamped by the other first excitation electrode and the first insulation layer. The second excitation electrode pair 9 includes two excitation electrodes II 9; one end of graphene resonant beam II 7 (the right end of graphene resonant beam II 7 shown in FIG. 4) is placed between the second excitation electrode of the two excitation electrodes II 9 and insulation layer III 8 and clamped by the second excitation electrode and the third insulation layer; the other end of graphene resonant beam II 7 (the left end of graphene resonant beam II 7 shown in FIG. 4) is located between the second excitation electrode and insulation layer I 3 and clamped by the second excitation electrode and the first insulation layer. In the implementation example, as an example, insulating silicon is used in substrate 1, and $SiO_2$ is used in insulation layer I 3, the second insulation layer 4, and insulating silicon III 8. A ring groove is etched on the substrate 1 to form a raised rectangular platform on the substrate; and insulation layer I 3 is covered in the middle of the upper surface of the raised rectangular platform on the substrate; the sensitive mass plate 2 is etched to form the sensitive mass block, a support beams of U-shaped thin plate structure and two graphene beams placing grooves symmetrically distributed along the axis of the mass plate, in which the axis of the mass plate can correspond to that of the graphene resonant beams 6 and 7, being the same as the longitudinal direction of the graphene resonator beams 6 and 7. Each of the graphene beam placing groove are constructed to be suitable for the placement of an excitation electrode for exciting the graphene resonator beams to reach the resonant state. The raised rectangular platform on the substrate is clearly shown in FIG. 3. It is located in the middle part of the substrate 1 and is surrounded by the annular groove etched on the substrate 1. Insulation layer I 3 can be formed in the middle part of the raised rectangular platform, as shown in FIG. 3. In FIG. 3, the left end of graphene resonant beam I 6 is clamped between the second insulation layer 4 and excitation electrode I 5 arranged above insulation layer II 4. The right end of graphene resonant beam I 6 is clamped between the left part of insulation layer I 3 and the other excitation electrode I 5 arranged above the left part of insulation layer I 3. The right end of graphene resonant beam II 7 is clamped between insulation layer III 8 and the second excitation electrode 9 arranged above insulation layer III 8, the left end of graphene resonant beam II 7 is clamped between the right part of insulation layer I 3 and another second excitation electrode 9 arranged above the right part of the first insulation layer 1. The sensitive mass blocks, U-shaped thin-plate structural support beams and two graphene beams placing grooves etched in the sensitive mass plate 2 are shown in FIGS. 1, 2 and 3. The corresponding etched sensitive mass plate 2 includes a sensitive mass plate frame, a U-shaped thin-plate structural support beam connected to the frame, and the sensitive mass blocks connected to the frame by the U-shaped thin-plate structural support beam and surrounded by the frame, and two graphene beams placing grooves etched in the sensitive mass block. As shown in FIG. 1, insulation layer II 4 and insulation layer III 8 are respectively arranged in the two graphene beams placing grooves. As can be seen from FIGS. 1 and 2, the frame of the sensitive mass plate is the most peripheral part of the etched sensitive mass plate 2, and the sensitive mass block is the middle part of the etched sensitive mass plate 2. The sensitive mass block is connected to the frame through a set of support beams of U-shaped thin-plate structure on each side of the transverse axis of the mass plate; in addition, the middle part of the sensitive mass block is etched, thus forming the hollow orifice part, in which the raised rectangular platform on the substrate 1 is located. Each support beams of U-shaped thin plate structure may include an opening corresponding to the opening side of U, a bottom corresponding to the bottom side of U and two arms corresponding to the two parallel sides of U. The arm of support beams of U-shaped thin plate structure may also be called arm or side or unilateral plate. Each set of support beams of U-shaped thin plate structure may include a pair of opposite support beams of U-shaped thin plate structures, such as those shown in FIGS. 2 and 4, or more pairs of support beams of U-shaped thin plate structures being oppositely placed, as shown in FIG. 5. Each pair of opposite support beams of U-shaped thin-plate structure includes two opposite U-shaped thin-plate structural support beams with opposite openings. In the case that each group of U-shaped thin-plate structural support beams includes a pair of opposite support beams of U-shaped thin-plate structure, each support beam of U-shaped thin-plate structure can be constructed so that one end of its opening, the free end of the outer arm of the support beams, is connected to the frame and the other end of its opening, the free end of the inner arm of the support beams, is connected to the sensitive mass. The two arms of the support beams are parallel to the corresponding side of the frame and the sensitive mass block and separated from the corresponding side of the frame and the sensitive mass block; that is, the connection between the sensitive mass plate frame and the free end of the corresponding arm (outer arm) of the support beams of U-shaped thin plate structure, and the connection between the sensitive mass block and the free end of the corresponding arm (inner arm) of the support beams of U-shaped thin plate structure. The connection part between the frame of the sensitive mass plate and the sensitive mass block is formed. In addition, the corresponding arms of two support beams of U-shaped thin-plate structure in each pair of opposite support beams of U-shaped thin-plate structure, which are aligned in a straight line, can be connected together, as shown in FIG. 2. In the case that each set of support beams of U-shaped thin plate structure includes a plurality of pairs of opposite support beams of U-shaped thin plate structure, similar to the situation mentioned above, a plurality of pairs of support beams of U-shaped thin plate structure can be arranged adjacent to each other. The free end of the outer arm for each support beams in the outermost pair of support beams of U-shaped thin plate structure is connected to the sensitive mass plate frame and the free end of the inner arm is connected to the free end of the outer arm of the adjacent support beam; the free end of the inner arm of each support beams in the innermost pair of support arms of U-shaped thin plate structure is connected to the sensitive mass block, and the free end of the outer arm is connected to the free end of the inner arm of the adjacent support beams. Besides, the free end of the outer arm and the free end of the inner arm for each support beams of each pair of support beams of U-shaped thin plate structure in the middle, if any, are connected to the free end of the outer arm and the free end of the inner arm (both ends of the opening part) of each support beams; the connection between the frame of the sensitive mass plate and the free end of the corresponding arm (outer arm) of the outermost support beams of U-shaped thin plate structure; and the connection between the sensitive mass block and the free ends of the corresponding arm (inner arm) of the corresponding beams of U-shaped thin plate structure constitutes the connection between the frame of the sensitive mass plate and the sensitive mass block, as shown in FIG. 5. The sensitive mass plate 2 is fixed above substrate 1, and the inner side of the frame is leveled with the outer side of the substrate groove except where the support beams of U-shaped thin plate structure is connected in the frame of sensitive mass plate; the upper surface of the two graphene beams placing groove in the sensitive mass plate 2 is covered with insulation layer II 4 and insulation layer III 8 respectively. The two ends of graphene resonant beam I 6 are adsorbed on insulation layer I 3 and insulation layer II 4, respectively. The two ends of the second resonant beam 7 are adsorbed in insulation layer I 3 and insulation layer III 8 respectively, thus forming two double-end-fixed-supported resonant beams, here, double-end-fixed-supported resonant beams are resonant beams with two ends fixed and supported. As mentioned above, excitation electrodes pair I 5 and excitation electrodes pair II 9 are placed on graphene resonant beam I 6 and graphene resonant beam II 7 respectively to excite resonant beams to be in resonant state. The vacuum cover 10 is bonded to the substrate, and the inner side of the groove on the top is leveled with the outer side of the frame of the sensitive mass plate, thus closing the accelerometer. The measured acceleration is transformed into a concentrated force through the sensitive mass plate 2, which results in a small axial displacement of the mass block of support beams of U-shaped thin-plate structure, and at the same time drives the displacement of one end of the double-ended fixed-supported first graphene resonant beam 6 and one end of graphene resonant beam II 7, thus causing the change of the axial stress of the graphene resonant beam; The end at which each displacement occurs for each of graphene resonant beam I 6 and graphene resonant beam II 7 is the end located on the sensitive mass block. The two axially resonant graphene beams work in differential mode. The axially accelerated acceleration causes the change of the axially stress of graphene. The axially stress of one resonant graphene beam increases and the resonant frequency increases. At the same time, the axially stress of the other resonant graphene beam decreases and the resonant frequency decreases. The measured acceleration can be characterized by measuring the resonant frequencies of two graphene resonant beams.

As shown in the figures, graphene resonant beam I 6 and graphene resonant beam II 7 can be aligned along the axis and arranged in a straight line.

The insulation layers I, II and III mentioned above can also be called a first insulation layer, a second insulation layer and a third insulation layer respectively. The excitation electrode pair I and the excitation electrode pair II mentioned above can also be called a first excitation electrode pair and a second excitation electrode pair, respectively. The graphene resonant beam I and the graphene resonant beam II mentioned above can also be called a first graphene resonant beam and a second graphene resonant beam, respectively.

In the first embodiment, the structure and parameters of the first set of sensors are given for acceleration with a small measurement range.

The material of the sensitive mass plate 2 and the substrate 1 are the same, both of which are insulated silicon, and they constitute the main body of the accelerometer. The length, width and thickness of the substrate are 70 micron× 70 micron×6 micron, the length, width and depth of the upper groove are 58 micron×58 micron×3 micron, and the length, width and height of the upper raised platform are 24 micron×14 micron×7 micron. The length, width and thickness of the sensitive mass plate 2 are 60 micron×60 micron×5 micron, the length, width and thickness of the sensitive mass plate 2 are 53 micron×53 micron×5 micron, and the thickness of the unilateral plate of each support beam of U-shaped thin plate on the sensitive mass plate 2 is 0.2 micron. The thickness of the unilateral plate of the support beam of U-shaped thin plate refers to the size of the single arm of the support beam of U-shaped thin plate in the axial direction.

Insulation layer I 3, insulation layer ii 4 and insulation layer III 8 can be formed by thermal growth oxidation and chemical vapor deposition of substrate 1. The thicknesses of the three insulation layers are all 0.5 um.

Graphene resonant beam I 6 and graphene resonant beam II 7 have the same material and geometric size. The length, width and thickness of the two beams are 10 micron×1 micron×0.335 nanometer (single layer). They are placed along the axis direction of the sensitive mass plate and in vacuum environment.

Graphene resonant beam I 6 and graphene resonant beam II 7 arrive at the resonant working state by electrical excitation mode through excitation electrode pair I 5 and excitation electrode pair II 9, respectively.

Figure 4:
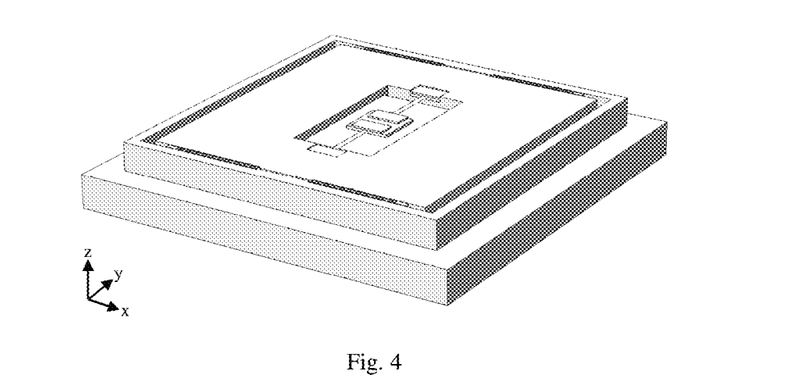
FIG. 4 is a simulation model diagram of an acceleration sensor provided in the first embodiment of the present invention.
Figure 5:
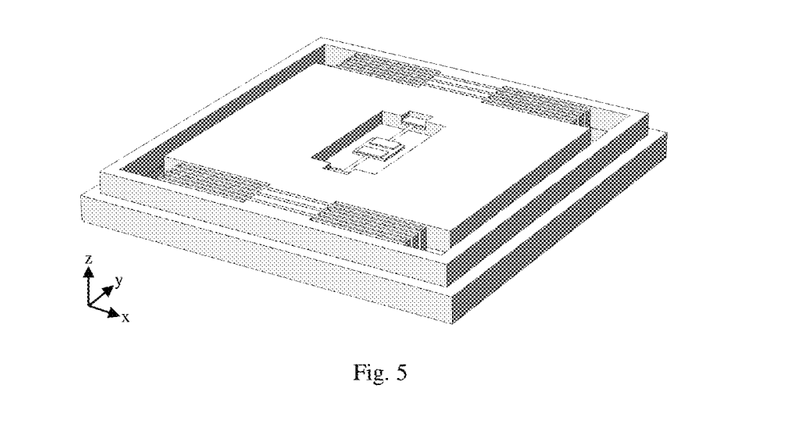
FIG. 5 is a simulation model diagram of the acceleration sensor provided in the second embodiment of the present invention.

As shown in FIG. 4, a simulation model is established for the first group of sensors. The axially measured acceleration is applied to the first group of sensors and the simulation calculation is carried out. The axially displacement of the sensitive mass plate in the same direction as the acceleration is applied is generated. Taking the axial direction of the sensitive mass plate in FIG. 4 as upward and downward, assuming that the direction of the axial displacement of the sensitive mass plate is upward, the upper U-shaped support beams is stretched, and the lower U-shaped support beams is compressed, and the stretching range is consistent with the compression range. At the same time, two graphene resonant beams are driven by the axial displacement of the sensitive mass plate to generate displacement. The first-order vibration mode is obtained by simulation calculation. The analysis of the first-order vibration mode shows that the upper-side graphene beam is stretched and the lower-side graphene beam is compressed. The vibration amplitude and resonant frequency of the two beams vary with the applied acceleration, and the difference between the two values is obvious. Differential measurement results are obtained by analyzing the difference of the two values.

In the second embodiment, the structure and parameters of the second group of sensors are given for measuring acceleration in a larger range.

The material of the sensitive mass plate 2 and the substrate 1 are the same, both of which are insulated silicon, and they constitute the main body of the accelerometer. The length, width and thickness of the substrate are 90 micron× 90 micron×6 micron, the length, width and depth of the upper groove are 78 micron×78 micron×3 micron, and the length, width and height of the upper raised platform are 24 micron×14 micron×7 micron. The length, width and thickness of the sensitive mass plate 2 are 84 micron×84 micron×5 micron, the length, width and thickness of the sensitive mass block on it are 58 micron×70 micron×5 micron, the length, width and thickness of the groove on the graphene beam are 6 micron×3 micron×2 micron, the number of the unilateral of the support beam of U-shaped thin plate is 6 (i.e., 3 pairs), the thickness of the unilateral plate is 0.5 micron, and the gap between the two unilateral plates, i.e. the gap between the two arms of the support beam of U-shaped thin plate, is 1 micron.

Insulation layer I 3, insulation layer II 4 and insulation layer III 8 can be formed by thermal growth oxidation and chemical vapor deposition of substrate 1. The thicknesses of the three insulation layers are 0.5 um.

The material and geometric dimensions of Graphene resonant beam I 6 and graphene resonant beam II 7 are the same. Their lengths and widths are 10 micron×1 micron, and their layers are all ten layers. The total thickness is 10*0.335=3.35 nm, in which the thickness of each layer (single layer) is 0.335 nm. They are placed along the axis direction of the sensitive mass plate and in a vacuum environment.

Graphene resonant beam I 6 and graphene resonant beam II 7 arrive at resonant working state by electrical excitation mode through excitation electrode pair I 5 and excitation electrode pair II 9, respectively.

As shown in FIG. 5, the simulation model of the second group of sensors is established, and the axial acceleration is applied to the second group of sensors and the simulation calculation is carried out. The axially displacement of the sensitive mass plate in the same direction as the acceleration is applied is generated. Taking the axial direction of the sensitive mass plate in FIG. 5 as upward and downward, assuming that the direction of the axial displacement of the sensitive mass plate is upward, the upper 6 (3 pairs) U-shaped support beams is stretched, and the lower 6 (3 pairs) U-shaped support beams is compressed, and the stretching range is consistent with the compression range. At the same time, two graphene resonant beams are driven by the axial displacement of the sensitive mass plate to generate displacement. The first-order vibration mode is obtained by simulation calculation. The analysis of the first-order vibration mode shows that the upper-side graphene beam is stretched and the lower-side graphene beam is compressed. The vibration amplitude and resonant frequency of the two beams vary with the applied acceleration, and the difference between the two values is obvious. Differential measurement results are obtained by analyzing the difference of the two values. At the same time, the vibration amplitude and resonance frequency of the graphene beam in the second group of acceleration sensors are quite different from those in the first group due to the change of the mass of the intermediate sensitive mass block and the difference of the equivalent stiffness of the U-shaped cantilever beam. Therefore, the second group of acceleration sensors is suitable for measuring acceleration with a larger range.

FIG. 4 and FIG. 5 show the x direction, y direction and z direction with coordinate axes. The y direction represents the axial direction of the sensitive mass plate, the x direction represents the lateral direction of the transverse direction of the sensitive mass plate, and the z direction represents the vertical direction orthogonal to both the axial direction and the transverse direction. In this specification, for the annular grooves and raised platform, sensitive mass plates, sensitive mass blocks, graphene resonant beams I, graphene resonant beams II and each insulation layer on the substrate, the length dimensions refers to the dimension along the axial direction of the sensitive mass plates, i.e. the y direction in FIGS. 4 and 5, and the width direction refers to the transverse direction along the axial direction, i.e. the x direction in FIGS. 4 and 5. The width dimension refers to the dimension along the width direction, thickness or depth dimensions refer to the dimensions along the vertical direction perpendicular to both the axial direction and the transverse direction, as shown in the z direction in FIGS. 4 and 5. For the excitation electrodes and graphene beams placing grooves, the width dimensions refers to the dimensions along the axial direction of the sensitive mass plate (x direction in FIGS. 4 and 5), the length direction refers to the dimension along the transverse direction in the transverse direction in the axial direction (x direction in FIGS. 4 and 5), the length dimensions refers to the dimensions along the length direction. And the thickness or depth direction refers to the vertical direction perpendicular to the axial direction and the transverse direction (the z direction in FIGS. 4 and 5). The thickness or depth dimensions refers to the dimensions along the thickness or depth direction. For a support beam of U-shaped thin-plate structure, the width of the whole support beam corresponds to the maximum size along the above-mentioned axial direction of the support beam, corresponding to the distance between the two outer arms of the support beam along the axial direction; the width (thickness of the unilateral plate) of the support beam refers to the size of the single arm in the axial direction; and the length of the arm of the support beam refers to the dimension of the arm in the above-mentioned lateral direction. The dimension also represents the length of the support beams; the thickness of the arm of the support beams refers to the dimension of the arm in the above-mentioned vertical direction, and also represents the thickness of the support beams. In addition, as mentioned above, each pair of opposite support beams of U-shaped thin-plate structure includes two support beams of U-shaped thin-plate structure with opening portions opposite; the length of each pair of support beams of U-shaped thin-plate structure refers to the maximum size of the support beams of U-shaped thin-plate structure in the above lateral direction, corresponding to the distance between the bottom of the two support beams of U-shaped thin-plate structure.

Each dimension of the present invention may be larger or smaller than the dimensions given in the embodiment.

The preparation of the invention can be realized by a series of processes such as inductively coupled plasma (ICP) etching, thermal oxidation, chemical vapor deposition (CVD), photolithography, oxygen plasma etching, electron beam evaporation, vacuum bonding technology, etc. Detailed description of existing technologies known to a person skilled in the art is not included in this specification.

What is claimed is:

1. An acceleration sensor with differential graphene resonant beams, comprising: a substrate (1), a sensitive mass plate (2), an insulation layer I (3), an insulation layer II (4), an excitation electrode pair I (5), a graphene resonant beam I (6), a graphene resonant beam II (7), an insulation layer III (8), an excitation electrode pair II (9) and a vacuum cover (10), wherein:

an annular groove is provided on the substrate (1) by way of etching and a raised rectangular platform is formed thereby on the substrate (1);

an upper surface of the raised rectangular platform on the substrate (1) is covered by insulation layer I (3);

the sensitive mass plate (2) is etched to form sensitive mass blocks symmetrically arranged about an axis of the sensitive mass plate (2), U-shaped thin plate support beams, two grooves for holding graphene beams, and a sensitive mass plate frame surrounding the sensitive mass plate;

the U-shaped thin plate support beams are arranged on two sides of the sensitive mass blocks in a direction traversing the axis of the sensitive mass plate and between the sensitive mass plate frame and the sensitive mass blocks;

the grooves for holding graphene beams accommodate excitation electrodes for the graphene resonant beams;

the sensitive mass plate (2) is fixed on the substrate (1), such that inner sides of the sensitive mass plate frame are aligned with outer sides of the annular groove on the substrate, except at locations where the sensitive mass plate frame is connected with the U- shaped thin plate support beams;

upper surfaces of the two grooves for holding graphene beams on the sensitive mass plate (2) are covered by insulation layer II (4) and insulation layer III (8) respectively;

two ends of graphene resonant beam I (6) are embedded in insulation layer 1 (3) and insulation layer II (4) respectively, and two ends of graphene resonant beam II (7) are embedded in insulation layer I (3) and insulation layer III (8) respectively, thereby forming two resonant beams each with both ends fixedly supported;

two excitation electrodes of excitation electrode pair I (5) are placed on both ends of graphene resonant beam I (6) for exciting graphene resonant beam I into a resonant state;

two excitation electrodes of excitation electrode pair II (9) are placed on both ends of graphene resonant beam II(7) for exciting graphene resonant beam II into a resonant state; and the vacuum cover (10) is mounted on the substrate (1), and inner sides of a groove thereon are aligned with outer sides of the sensitive mass plate frame, thereby sealing the acceleration sensor.

2. The acceleration sensor according to claim 1, wherein the same materials are used for the substrate (1) and the sensitive mass plate (2), which form a main body of the acceleration sensor.

3. The acceleration sensor according to claim 1, wherein:
insulation layer I (3), insulation layer II (4) and insulation layer III (8) are formed by thermal growth oxidation of the substrate (1) and chemical vapor deposition, and insulation layer I (3), insulation layer II (4) and insulation layer III (8) have the same thickness which is not greater than 1/5 of a thickness of the sensitive mass plate (2).

4. The acceleration sensor according to claim 1, wherein:
the materials and geometric dimensions of graphene resonant beam I (6) and graphene resonant beam II (7) are identical, a thickness of each graphene resonant beam being the thickness of one or more layers of graphene, a length and width of each graphene resonant beam being substantially greater than its thickness, a length to width ratio of each graphene resonant beam being no less than 5, and graphene resonant beam I and graphene resonant beam II are arranged along the axial direction of the sensitive mass plate (2) and in a vacuum environment.

5. The acceleration sensor according to claim 1, wherein:
both graphene resonant beam I (6) and graphene resonant beam II (7) are excited by electrical excitation, and both excitation electrode pair I (5) and excitation electrode pair II (9) are connected with an external electrical circuit.

6. The acceleration sensor according to claim 1, wherein:
materials for the substrate (1) and the sensitive mass plate (2) include monocrystalline silicon or silicon carbide, and materials for insulation layer I (3), insulation layer II (4) and insulation layer III (8) include silicon dioxide or silicon nitride.

7. The acceleration sensor according to claim 1, wherein:
the sensitive mass plate (2) is provided with four or more U-shaped thin plate support beams having identical geometric dimensions, and the number of U-shaped thin plate support beams on each side of the sensitive mass blocks is two or a multiple of two.

8. The acceleration sensor according to claim 1, wherein:
a distance between the annular groove on the substrate (1) and each side of the substrate is greater than 6 μm, and a thickness of the sensitive mass plate frame is not less than 1/3 of a distance between the annular groove and a corresponding side of the substrate (1), and not greater than 1/2 of the distance between the annular groove and the corresponding side of the substrate (1).

9. The acceleration sensor according to claim 1, wherein the geometric dimensions of inner sides of the sensitive mass plate frame are identical to those of outer sides of the annular groove on the substrate (1).

10. The acceleration sensor according to claim 1, wherein a depth of the annular groove on the substrate (1) is not less than 1/6 of a thickness of the substrate (1) and not greater than 2/3 of the thickness of the substrate (1).

11. The acceleration sensor according to claim 1, wherein:
the middle part of the sensitive mass block is provided with a hollow orifice portion, the raised rectangular platform is located in the orifice portion, and the geometric center of the raised rectangular platform overlaps the geometric center of the substrate (1); and the length and width of the raised rectangular platform are configured such that a distance from each side of the raised rectangular platform to a corresponding inner side of the sensitive mass block is not less than twice the width of the U-shaped thin plate support beam.

12. The acceleration sensor according to claim 1, wherein a height of the raised rectangular platform is configured such that an upper surface of the raised rectangular platform and a bottom surface of the grooves for holding graphene resonant beams fall in the same horizontal plane.

13. The acceleration sensor according to claim 1, wherein:
the length of each excitation electrode in excitation electrode pair I (5) and excitation electrode pair II (9) is not less than the width of the corresponding graphene resonant beam, the width of each excitation electrode is not greater than the width of the grooves for holding graphene resonant beams, and the thickness of each excitation electrode is not greater than 1/5 of the thickness of the sensitive mass plate (2).

14. The acceleration sensor according to claim 1, wherein:
the length and width of insulation layer I (3) are not less than those of each excitation electrode, and not greater than those of the raised rectangular platform, the length and width of insulation layer II (4) and insulation layer III (8) are consistent with those of the grooves for holding graphene resonant beams, and insulation layer I (3), insulation layer II (4) and insulation layer III (8) are of the same thickness, which is not greater than 1/5 of the thickness of the sensitive mass plate (2).

15. The acceleration sensor according to claim 1, wherein:
the width of a single arm of each U-shaped thin plate support beam is 1/4 of the width of the whole U-shaped thin plate support beam, the distance between two arms of each U-shaped thin plate support beam is 1/2 of the width of the whole U-shaped thin plate support beam, and the length of each pair of U-shaped thin plate support beams on one side of the sensitive mass block is not less than 1/2 of the width of the sensitive mass block, and the thickness of each U-shaped thin plate support beam is same as the thickness of the sensitive mass block.

* * * * *